United States Patent
Kundaliya et al.

(10) Patent No.: US 10,862,008 B2
(45) Date of Patent: Dec. 8, 2020

(54) CERAMIC CONVERSION ELEMENT, LIGHT-EMITTING DEVICE AND METHOD FOR PRODUCING A CERAMIC CONVERSION ELEMENT

(71) Applicant: OSRAM Opto Semiconductors GmbH, Regensburg (DE)

(72) Inventors: Darshan Kundaliya, Middleton, MA (US); Norwin von Malm, Nittendorf (DE); Jeffery J. Serre, Peabody, MA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/196,775

(22) Filed: Nov. 20, 2018

(65) Prior Publication Data

US 2020/0161512 A1    May 21, 2020

(51) Int. Cl.
*H01L 33/50* (2010.01)
*H01L 25/075* (2006.01)

(52) U.S. Cl.
CPC ........ *H01L 33/505* (2013.01); *H01L 25/0753* (2013.01); *H01L 33/502* (2013.01); *H01L 2933/0041* (2013.01)

(58) Field of Classification Search
CPC . H01L 33/505; H01L 25/0753; H01L 33/502; H01L 2933/0041
See application file for complete search history.

(56) References Cited

U.S. PATENT DOCUMENTS

| | | | |
|---|---|---|---|
| 10,103,296 B2 | 10/2018 | Singer et al. | |
| 2005/0105860 A1* | 5/2005 | Oono | G02B 6/4206 385/88 |
| 2008/0042153 A1* | 2/2008 | Beeson | H05B 33/10 257/94 |
| 2010/0038665 A1 | 2/2010 | Sugiura et al. | |
| 2011/0090696 A1* | 4/2011 | Nagai | H01L 33/505 362/293 |
| 2016/0087167 A1* | 3/2016 | Kundaliya | H01L 33/505 428/162 |
| 2016/0240763 A1* | 8/2016 | Busse | H01L 35/34 |
| 2017/0184707 A1* | 6/2017 | Sugiura | G01S 7/4817 |
| 2020/0048547 A1 | 2/2020 | Kundaliya et al. | |

FOREIGN PATENT DOCUMENTS

| | | |
|---|---|---|
| DE | 102014114372 A1 | 4/2016 |
| WO | 2013148276 A1 | 10/2013 |
| WO | 2016087600 A1 | 6/2016 |

* cited by examiner

*Primary Examiner* — Fernando L Toledo
*Assistant Examiner* — Neil R Prasad
(74) *Attorney, Agent, or Firm* — Slater Matsil, LLP

(57) ABSTRACT

A ceramic conversion element, a light-emitting device and a method for producing a ceramic conversion element are disclosed. In an embodiment a ceramic conversion element includes a central region with a structured top surface including a plurality of structure elements and a frame surrounding the central region, the frame having a planar top surface, wherein the central region and the frame are formed as one piece, and wherein the ceramic conversion element is configured to convert primary radiation into secondary radiation of a different wavelength range.

10 Claims, 3 Drawing Sheets

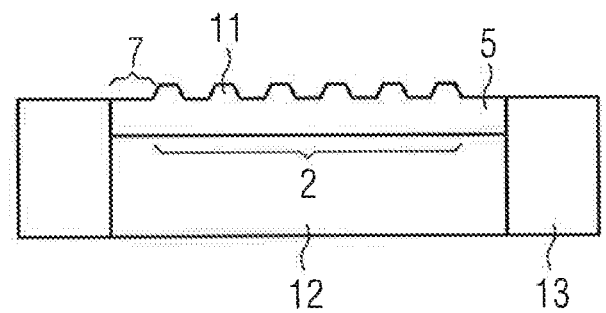
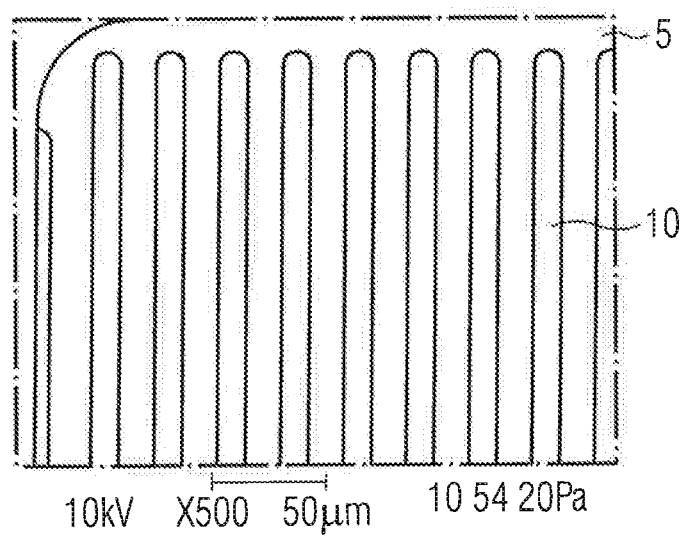

CERAMIC CONVERSION ELEMENT, LIGHT-EMITTING DEVICE AND METHOD FOR PRODUCING A CERAMIC CONVERSION ELEMENT

TECHNICAL FIELD

A ceramic conversion element is provided. Furthermore, a light-emitting device and a method for producing a ceramic conversion element are provided.

BACKGROUND

Conversion elements are frequently employed in light emitting devices, such as LEDs (light emitting diodes) or LASERs (light amplification by stimulated emission of radiation devices). The efficiency of the light emitting devices depends, inter alia, on the surface structure of the conversion elements.

SUMMARY

Embodiments provide a ceramic conversion element which has an improved efficiency. Further embodiments provide a light-emitting device having such a ceramic conversion element and a method for producing such a ceramic conversion element.

According to at least one embodiment, the ceramic conversion element is formed to convert primary radiation into secondary radiation of a different wavelength range. Preferably, the ceramic conversion element comprises a phosphor, which converts primary radiation of a first wavelength range into secondary radiation of a second wavelength range. The second wavelength range is different from the first wavelength range and preferably comprises longer wavelengths than the first wavelength range. For example, the primary radiation may be UV light or blue light and the secondary radiation may be visible light, such as yellow, green or red light.

The entire ceramic conversion element is particularly preferably completely formed from ceramic materials. Preferably, the ceramic conversion element is a monolithic conversion element.

According to at least one embodiment, the ceramic conversion element comprises a central region with a structured top surface having a plurality of structure elements. The structured top surface is opposite to a bottom surface of the central region, which does not have any structure elements. Preferably, the bottom surface of the central region is substantially planar. The term "substantially planar" means that the bottom surface of the central region is planar within the bounds of manufacturing tolerances. Preferably, the bottom surface of the central region comprises recesses or projections having an extension in a vertical direction of at most 1 micrometer. The vertical direction is perpendicular to a main extension plane of the ceramic conversion element.

A radiation exit surface of the ceramic conversion element comprises preferably the structured top surface. The radiation exit surface of the ceramic conversion element is preferably configured to emit primary radiation and/or secondary radiation. In other words, the radiation exit surface of the ceramic conversion element is preferably a surface from which primary radiation and/or secondary radiation is/are coupled out from the ceramic conversion elements for the most part.

A radiation entrance surface of the ceramic conversion element comprises preferably the bottom surface of the central region. The radiation entrance surface of the ceramic conversion element is preferably configured for the entrance of primary radiation. In other words, the radiation entrance surface is preferably a surface at which primary radiation is coupled into the ceramic conversion element for the most part.

The structured top surface advantageously leads to a change in the angle of impact of primary radiation and/or secondary radiation on the radiation exit surface of the ceramic conversion element. Due to the changed angle of impact less inner total reflection of primary radiation and/or secondary radiation occurs at the radiation exit surface. Thus, coupling out of primary radiation and/or secondary radiation off the ceramic conversion element via the radiation exit surface is advantageously increased. Furthermore, the structure elements of the structured top surface may have specific geometries allowing the direction of the emitted primary radiation and/or the secondary radiation to be controlled.

According to at least one embodiment, the ceramic conversion element comprises a frame surrounding the central region. Preferably, the frame has a planar top surface. Preferably, the planar top surface of the frame is arranged opposite to a bottom surface of the frame. The top surface of the frame and the bottom surface are preferably parallel to one another.

The bottom surface of the frame and the bottom surface of the central region are preferably in a common plane. Preferably, a bottom surface of the ceramic conversion element, comprising the bottom surface of the frame and the bottom surface of the central region, is substantially planar. The term "substantially planar" means here that the bottom surface of the frame and the bottom surface of the central region is planar within the bounds of manufacturing tolerances. The planar top surface of the frame is preferably parallel to the bottom surface of the ceramic conversion element.

The planar top surface and the bottom surface of the frame are connected by at least one side surface of the ceramic conversion element. Further, the central region of the ceramic conversion element is preferably spaced apart in a lateral direction from the side surface of the ceramic conversion element.

The distance between the central region of the ceramic conversion element and its side surface is preferably determined by a width of the frame. Preferably, the width of the frame is at least 5 micrometers and at most 500 micrometers.

Preferably, the frame surrounds the central region completely. Particularly preferably, the structure elements of the central region are spaced apart from the side surface of the ceramic conversion element. Particularly preferably, the structure elements are not part of the side surface of the ceramic conversion element.

Furthermore, the radiation exit surface of the ceramic conversion element comprises preferably the planar top surface. However, primary radiation and/or secondary radiation is/are coupled out of the ceramic conversion element for the most part through the central region. Preferably, at least 90% of the primary radiation and/or secondary radiation are coupled out of the ceramic conversion element through the central region, particular preferably at least 95%.

According to at least one embodiment, the central region and the frame are formed as one piece. Preferably, the central region and the frame of the ceramic conversion element result from a single ceramic conversion element. Thus, the central region and the frame are bonded to one another in an integrally joined and mechanically stable manner without an adjoining layer.

According to an embodiment, a ceramic conversion element, converting primary radiation into secondary radiation of a different wavelength range, comprises a central region with a structured top surface having a plurality of structure elements, and a frame surrounding the central region, the frame having a planar top surface, wherein the central region and the frame are formed as one piece.

According to at least one embodiment, the planar top surface of the frame terminates flush with the structured top surface between neighboring structure elements. In this case, the structured top surface between neighboring structure elements are located in a common plane. This common plane is then located in a further common plane with a plane of the planar top surface of the frame. However, if the structure elements are recesses or projections, the structured top surface of the structure elements can be above or below the structured top surface between neighboring structure element.

"Above" means that the structured top surface of the structure element is further away from the bottom surface of the central region than the structured top surface between neighboring structure elements. Consequently, "below" means that the structured top surface of the structure element is closer to the bottom surface of the central region than the structured top surface between neighboring structure elements.

Preferably, the planar top surface of the frame is in a common plane with the structured top surface between neighboring structure elements so that the planar top surface of the frame and the structured top surface between neighboring structure element terminate flush with one another.

For example, the ceramic conversion element may have a first height and a second height in the central region. In this case, the first height is defined as the maximal extent in the vertical direction in a region between direct neighboring structure elements. Further, the second height is defined as the maximal extent in the vertical direction in the region of a structure element. The height of the frame is defined as the maximal extent in the vertical direction from the bottom surface to the planar top surface of the frame.

Preferably, the height of the frame and the first height are substantially equal. The term "substantially equal" means that the height of the frame and the first height are equal within the bounds of manufacturing tolerances. Further, the second height may be smaller than the height of the frame. Alternatively, the second height is bigger than the height of the frame.

According to at least one embodiment, the planar top surface of the frame protrudes above the structured top surface between neighboring structure elements in the vertical direction. For example, in this case, the height of the frame and the first height are different. Further, the height of the frame may be larger than the first height. In addition, it is possible that the second height may be smaller than the height of the frame. Alternatively, the second height is greater than the height of the frame.

According to at least one embodiment, the frame and the central region are formed from the same material. Since the central region and the frame are formed as one piece, i.e., the central region and the frame of the ceramic conversion element result from a single ceramic conversion element, the frame and the central region comprise the same material.

For the phosphor of the ceramic conversion element any one of the following materials is suitable: Garnets doped with rare earths, alkaline earth sulfides doped with rare earths, thiogallates doped with rare earths, aluminates doped with rare earths, silicates doped with rare earths, orthosilicates doped with rare earths, rare earth doped chlorosilicates, rare earth doped alkaline earth silicon nitrides, rare earth doped oxynitrides, rare earth doped aluminum oxynitrides, rare earth doped silicon nitrides, rare earth doped sialons.

According to at least one embodiment, the structure elements are arranged in a regular pattern and spaced apart from one another, having a distance between direct neighboring structure elements. Preferably, the structure elements are spaced apart in lateral directions. The distance between direct neighboring structure elements may be preferably between 50 micrometers and 100 micrometers, particularly preferably between 10 micrometers and 50 micrometers.

According to at least one embodiment, the structure elements are arranged in a non-regular pattern. In this case, the distance between direct neighboring structure elements may vary and are preferably between 5 micrometers and 100 micrometers, particularly preferably between 10 micrometers and 50 micrometers.

According to at least one embodiment, the frame has a width larger than or equal to the distance between two direct neighboring structure elements. In addition, the width of the frame is preferably larger than or equal to the distance between direct neighboring structure elements. Alternatively, the frame has a width smaller than the distance between two direct neighboring structure elements. In this case, the width of the frame may be smallest achievable.

According to at least one embodiment the structure elements are recesses, which do not penetrate the conversion element completely. The recesses penetrating the ceramic conversion element in the central region have a defined depth. In this case, the structured top surface of the structure elements is preferably arranged below the structured top surface between neighboring structure elements in the vertical direction and below the planar top surface of the frame in the vertical direction.

According to at least one embodiment, the structure elements are formed as grooves extending parallel to one another. Preferably, the recesses may be linearly extending recesses forming the grooves. The grooves preferably extend in the lateral direction. Furthermore, the distances between adjacently extending grooves are preferably constant for all adjacent grooves. The grooves are preferably formed equidistant to one another.

According to one embodiment, the grooves comprise a first group and a second group, and the first group extends transversely to the second group. Preferably, the first group of parallel equidistant grooves intersects the second group of parallel equidistant grooves, for example, at an angle of 90°.

According to at least one embodiment, the structure elements are formed as recesses or projections, the recesses or projections being arranged in lines and columns. Preferably, the structure elements are arranged at grid points of a regular grid. The grid is, for example, a triangular grid, a square grid or a hexagonal grid. Alternatively, the recesses are arranged at grid points of an irregular grid. Preferably, the grid points of the regular grid or the irregular grid extend in the lateral direction.

The recesses or the projections may have a rectangular shape, a trapezoidal shape, a pyramidal shape, a truncated pyramidal shape or a cylindrical shape. Furthermore, the depth of the recesses may be preferably between 5 micrometers and 50 micrometers, particularly preferably between 10 micrometers and 20 micrometers. Alternatively, the projections may have a height which is preferably between 5 micrometers and 50 micrometers, particularly preferably between 10 micrometers and 20 micrometers.

Furthermore, a light-emitting device is provided. The ceramic conversion element described above is configured to be used in the light emitting device. Features and embodiments described in connection with the ceramic conversion element can be also embodied in connection with the light-emitting device and vice versa.

According to at least one embodiment, the light-emitting device comprises a radiation-emitting semiconductor chip emitting primary radiation from a radiation exit area during operation. Preferably, the semiconductor chip is a light-emitting diode chip.

According to at least one embodiment, the light-emitting device comprises a ceramic conversion element converting primary radiation into secondary radiation of a different wavelength range. Preferably, the ceramic conversion element is the ceramic conversion element described hereinbefore. Thus, all features disclosed in connection with the ceramic conversion element are also disclosed in connection with the light-emitting device and vice versa.

According to at least one embodiment, the ceramic conversion element is arranged on the radiation exit area of the semiconductor chip. The ceramic conversion element is arranged preferably in the beam path of the semiconductor chip. For example, the bottom surface of the ceramic conversion element, being the radiation entrance surface of the ceramic conversion element, may be arranged in direct contact with the radiation exit surface of the semiconductor chip. Further, the ceramic conversion element may be glued onto the radiation exit surface of the semiconductor chip, for example, using a silicone. If the ceramic conversion element is in direct contact with the radiation-emitting semiconductor chip, a particularly good cooling of the ceramic conversion element in operation of the light-emitting device is possible.

According to at least one embodiment, the light-emitting device comprises a mold surrounding the semiconductor chip and the conversion element. The mold preferably surrounds at least one side surface of the semiconductor chip preferably completely. The mold surrounding the side surface of the semiconductor chip completely is preferably in direct contact with the side surface of the semiconductor chip.

Furthermore, the mold surrounds the ceramic conversion element completely in the lateral direction and is preferably in direct contact with the ceramic conversion element. The side surface of the conversion element is covered by the mold, preferably at least in places in the vertical direction. It is further possible that the mold completely covers the side surface of the ceramic conversion element.

Preferably, the mold is formed reflective for primary radiation and/or secondary radiation. Further, the mold comprises preferably a matrix material, in which preferably radiation reflective particles are introduced. The matrix material may be a resin, such as an epoxy or a silicone, or a mixture of these materials. The radiation reflective particles are, preferably, titanium dioxide particles. Preferably, the mold comprising the radiation reflective particles is formed to reflect the primary radiation and/or secondary radiation by at least 90%.

According to at least one embodiment, the structured top surface of the ceramic conversion element is free of the mold. Preferably, the mold does not protrude above the structured top surface of the ceramic conversion element in the vertical direction. Preferably, the planar top surface of the frame is also free of the mold.

Since the structured top surface of the conversion element is free of the mold, generally the primary and secondary radiation are coupled out from the radiation exit surface of the conversion element without losses due to the reflective mold on the top surface of the ceramic conversion element.

According to at least one embodiment, the structure elements have a first height being the maximal vertical extension of the structure elements in the central region. If the structure elements are formed as recesses, the first height is a height of the structured top surface between adjacent structure elements. Further, if the structure elements are formed as projections, the first height is a height of the structured top surface of the structure elements.

According to at least one embodiment, the structure elements have a second height being the minimal vertical extension of the structure elements in the central region. If the structure elements are formed as recesses, the second height is a height of the structured top surface of the structure elements. Further, if the structure elements are formed as projections, the second height is a height of the structured top surface between adjacent structure elements.

According to at least one embodiment, the mold extends in the vertical direction to a third height between the first height and the second height. Alternatively, the frame can protrude above the first height.

According to at least one embodiment, the mold extends in the vertical direction to a third height equal to the first height. In this case, the frame preferably terminates flush with the structured top surface with the first height.

One idea of the light-emitting device described here is, inter alia, to use a ceramic conversion element with structure elements in the central region of a top surface, the structure elements being surrounded by a frame. Further, the mold preferably has a liquid form during its application. The mold should cover preferably a large area of the side surface of the ceramic conversion element, since this increases the reflection of primary radiation and/or secondary radiation in the direction towards the structured top surface of the ceramic conversion element. Advantageously, the frame acts as a barrier for the mold during its application such that the mold in the liquid form does not flow into the recesses or between the projections. The structured top surface is preferably free of the mold, which advantageously increases the efficiency of the ceramic conversion element and the light-emitting device. Further, since the structured top surface is preferably free of the mold, a difference in an index of refraction between the ceramic conversion element and, for example, air is maintained. In principle, the brightness of the light emitting device can be increased by up to 3% due to the structured top surface, which is free of the mold. Furthermore, an angular uniformity is increased by up to $\Delta C_x(60-0)<0.01$, due to the structured top surface.

Furthermore, a method for producing a ceramic conversion element is provided. Preferably, the method produces a ceramic conversion element described hereinbefore. All features disclosed in connection with the ceramic conversion element are therefore also disclosed in connection with the method and vice versa.

According to at least one embodiment, the method comprises the step of providing a base body. The base body can be a green body or a ceramic base body such as a sintered base body. The base body preferably comprises a phosphor, which converts primary radiation into secondary radiation of a different wavelength range.

According to at least one embodiment, the method comprises the step of producing a plurality of structure elements on a top surface of the base body in a central region.

According to at least one embodiment, the method comprises the step of producing a frame surrounding the central region, the frame having a planar top surface.

According to at least one embodiment, the central region of the base body and the frame are formed in one piece.

According to at least one embodiment, the base body is a green body comprising a ceramic material. For producing a green body, preferably a slurry is produced by mixing ceramic phosphor particles with an organic binder. Subsequently, the green body is formed from the slurry by a forming method such as tape casting, injection molding, slip casting, dry pressing, isostatic pressing or hot isostatic pressing. The green body results from the formed slurry by drying. Such a produced green body, respectively, has preferably the form of a cuboid or a plate.

According to at least one embodiment, the green body is transformed to the conversion element by sintering the green body. During the sintering process of the green body, the organic binder is removed preferably completely. The finished ceramic conversion element is preferably free of the organic binder.

During sintering the green body and transforming the green body to the conversion element, the finished conversion element is diminished in size by approximately 15% to 20% compared to the volume of the green body. Furthermore, during the sintering process the structure elements of the green body preferably shrink also by approximately 15% to 20%.

According to at least one embodiment, the structure elements are produced in an unsintered green body by a first tool. Also, the frame can be produced in the unsintered green body by a second tool.

According to at least one embodiment, the first tool is formed to produce the structure elements in the unsintered green body by embossing. Preferably, the first tool comprises a stamp. Further, preferably the structure elements are embossed in the green body, with the stamp that transfers a pattern of the stamp to the green body. The embossing can be accomplished in a number of ways such as using a stamp, a hot press or a roller. Preferably, the pattern of the stamp is formed as recesses or projections, which correspond to an inverse geometry of the structure elements of the green body.

According to at least one embodiment, the second tool is formed to produce the frame in the unsintered green body by punching. Preferably, the second tool is a punching tool. Further, the green body in a sintered or unsintered state can be singulated by punching. This singulation separates the base body into smaller pieces. During the step of punching lateral dimensions of the base body may be specified.

Alternatively, the base body may be separated into portions via cutting.

According to at least one embodiment, the structure elements are produced in the sintered green body by a first tool, and the first tool is a laser. The structure elements are produced in the sintered green body by laser structuring, such as laser scribing. Alternatively, the structure elements may be produced in the unsintered green body by a laser.

Laser structuring has the advantage over embossing that the handling is easier. Further, the yield is better when using laser structuring in comparison to other methods. However, laser structuring is quite slow and thus expensive in comparison to embossing.

According to at least one embodiment, the structure elements and the frame are produced in an unsintered green body by a third tool, and the third tool is formed to produce the structure elements in the base body and to produce the frame by embossing and punching. In this case, the first tool and the second tool are preferably merged together in a third tool.

According to at least one embodiment, the base body is arranged temporarily on a solid die during the production of the structure elements. In order to produce the structure elements, the first tool or the third tool with the stamp has to be pressed against the base body. Thus, the base body has to be arranged on a support being the solid die.

According to at least one embodiment, the base body is arranged temporarily on a hollow die during the production of the frame. Preferably, the hollow die comprises an opening, which has a larger area in the lateral direction than an area in which the structure elements are arranged, being the central region.

The base body with the central region is arranged on the hollow die such that the central region is arranged preferably in the center of the opening. Subsequently, the region of the base body overlapping with the opening in plan view is pressed or punched through the opening by the second tool or third tool. The base body is preferably singulated by punching, i.e., the base body is separated into a smaller piece. Since the area of the opening is preferably larger than the area of the central region, an edge area of the separated base body forms the frame.

BRIEF DESCRIPTION OF THE DRAWINGS

The ceramic conversion element, the light-emitting device and the method for producing a ceramic conversion element described herein are explained in greater detail below with reference to exemplary embodiments and the associated figures, in which:

FIGS. 2A, 2B and 2C show schematic sectional representations of light emitting devices according to exemplary embodiments;

FIGS. 3 and 4 show exemplarily scanning electron microscopy images representing the surface morphology of ceramic conversion elements;

Identical, similar or identically acting elements are provided with the same reference signs in the figures. The figures and the size ratios of the elements represented in the figures among one another are not drawn to scale. Rather, individual elements, in particular layer thicknesses, can be represented exaggeratedly large for better illustration and/or for better comprehension.

DETAILED DESCRIPTION OF ILLUSTRATIVE EMBODIMENTS

Figure 1:
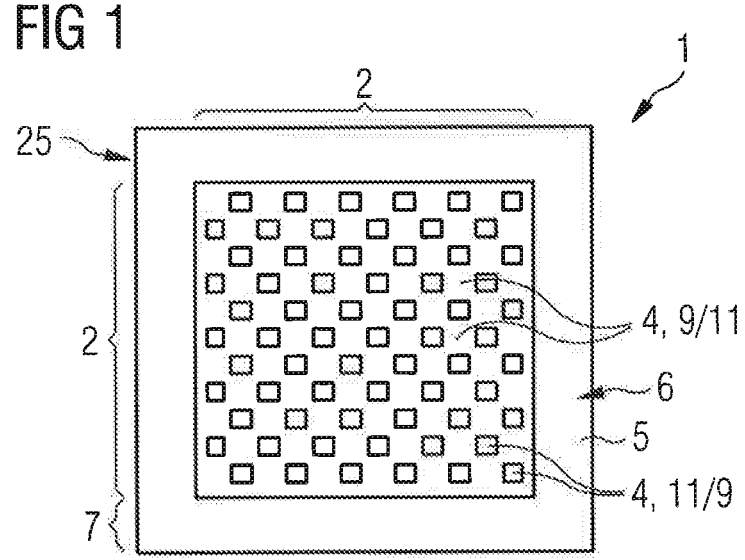
FIG. 1 shows a schematic representation of a ceramic conversion element in a plan view according to an exemplary embodiment.

The ceramic conversion element 1 according to the exemplary embodiment of FIG. 1 comprises a central region 2 with a structured top surface 3 having a plurality of structure elements 4.

The structured top surface 3 forms a radiation exit surface of the ceramic conversion element 17. A bottom surface of the central region lying opposite to the radiation exit surface forms a radiation entrance surface of the ceramic conversion element 18. The conversion element converts primary radiation into secondary radiation. For example, the conversion element converts blue light into yellow light. Primary radiation and secondary radiation are coupled out of the radiation exit surface of the ceramic conversion element 17 for the most part.

The structure elements 4 are formed as recesses 9 or projections 11. The structure elements 4 are arranged at grid points of a regular triangular grid, extending in the lateral direction. The recesses or the projections have a rectangular shape. Furthermore, the depth of the recesses may be between 5 micrometers and 50 micrometers, preferably between 10 micrometers and 20 micrometers. Alternatively, the projections preferably may have a height of between 5 micrometers and 50 micrometers, particularly preferably between 10 micrometers and 20 micrometers.

Since the structure elements 4 are arranged in a regular triangular pattern, adjacent structure elements 4 are spaced apart from one another, so that there is a distance between adjacent structure elements 8. The distance between adjacent structure elements 8 is the distance of opposite side surfaces of adjacent structure elements 4 at present.

Further, the ceramic conversion element 1 comprises a frame 5 surrounding the central region 2, the frame 5 having a planar top surface 6. The planar top surface 6 and a bottom surface of the frame 5 are connected by at least one side surface of the ceramic conversion element 25. Further, the central region 2 of the ceramic conversion element 1 is spaced apart in the lateral direction from the side surface of the ceramic conversion element 25, defining the width 7 of the frame 5.

The frame 5 surrounds the central region 2 completely. Thus, the structure elements 4 do not have any contact to the side surface of the ceramic conversion element 25. Further, the width 7 of the frame 5 is larger than the distance between adjacent structure elements 8.

The central region 2 and the frame 5 of the ceramic conversion element 1 are formed as one piece. The central region 2 and the frame 5 are continuously connected to each other without any boundary.

Figure 2A:
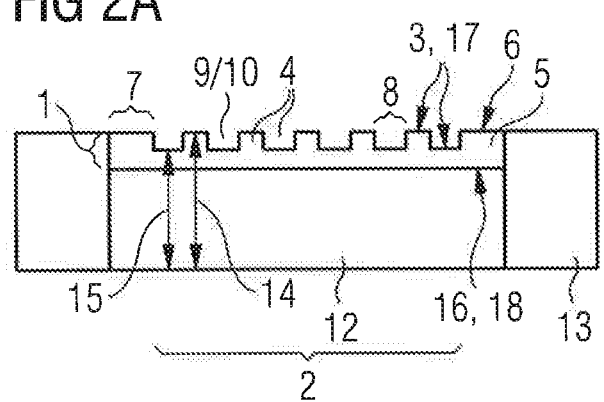

The light emitting device according to the exemplary embodiment of FIG. 2A comprises the ceramic conversion element 1 and a radiation emitting semiconductor chip 12. The semiconductor chip 12 comprises a radiation exit area 16 through which primary radiation is coupled out.

The ceramic conversion element 1 is arranged on the radiation exit area of the semiconductor chip 16. Further, the ceramic conversion element 1 is arranged in the beam path of the semiconductor chip 12. The radiation entrance surface of the ceramic conversion element 18 is arranged in direct contact with the radiation exit surface of the semiconductor chip 16.

A mold 13, which is formed reflective for the primary radiation and secondary radiation, surrounds the semiconductor chip 12 and the ceramic conversion element 1. The mold 13 surrounds and covers at least one side surface of the semiconductor chip 12 completely. Further, the mold 13 is in direct contact with the side surface of the semiconductor chip 12.

Furthermore, the mold 13 surrounds the ceramic conversion element 1 completely in the lateral direction and is in direct contact with the ceramic conversion element 1. The side surface of the conversion element 25 is covered by the mold 13 in places. The structured top surface 3 of the ceramic conversion element 1 is free of the mold 13. In particular, the frame 5 prevents the structured top surface 3 of the ceramic conversion element 1 to be polluted with mold material during the casting process.

The structure elements 4 have a first height 14 being the maximal vertical extension of the structure elements 4 in the central region 2. Further, the structure elements 4 have a second height 15 being the minimal vertical extension of the structure elements 4 in the central region 2. The mold 13 extends in the vertical direction to a third height between the first height 14 and the second height 15. Thus, the frame 5 is not arranged above the first height 14 or is arranged below the second height 15. However, the mold 13 may terminate flush with the structured top surface 3 with the first height 14.

Figure 2B:
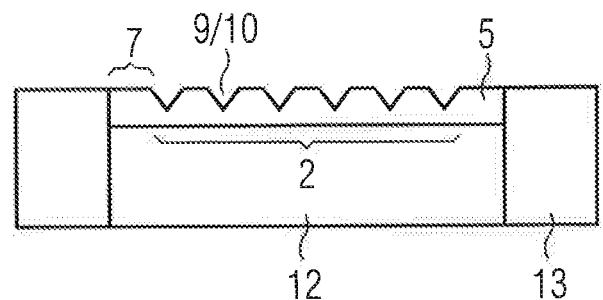

The structure elements 4 of the light emitting device according to the exemplary embodiment of FIG. 2B are formed in contrast to the exemplary embodiment of FIG. 2A as recesses 9 having a pyramidal shape. Here, the structured top surface of the structure elements are below the structured top surface between neighboring structure elements.

Further, the structure elements 4 of the light emitting device according to the exemplary embodiment of FIG. 2C are formed in contrast to the exemplary embodiment of FIG. 2B as projections 11 having the shape of a truncated pyramid. In this case, the structured top surface of the structure elements are above the structured top surface between neighboring structure elements.

The scanning electron microscopy image of FIG. 3 shows a ceramic conversion element after sintering.

The structure elements 4 are formed as grooves 10 extending parallel to one another. The distances between adjacently extending grooves 10 are constant for all adjacent grooves 10. The grooves 10 are formed equidistant to one another. Here, the grooves are produced by a laser process.

Figure 4:
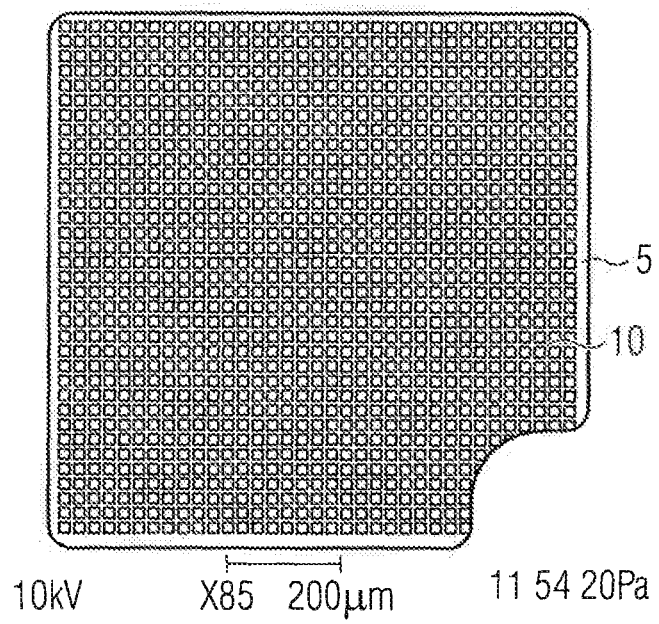

The scanning electron microscopy image of FIG. 4 shows a different ceramic conversion element 1 than FIG. 3. The conversion element shown in FIG. 4 comprises a first group of grooves and a second group of grooves. The first group of parallel equidistant grooves 10 intersects the second group of parallel equidistant grooves 10 at an angle of 90°.

The ceramic conversion element 1 has a recess at an edge. Preferably, the recess leaves a region, which may be a bonding region, free of the ceramic conversion element 1. At the bonding region the semiconductor chip 12 may be electrically conductively connectable by, for example, a bonding wire.

Figure 5:
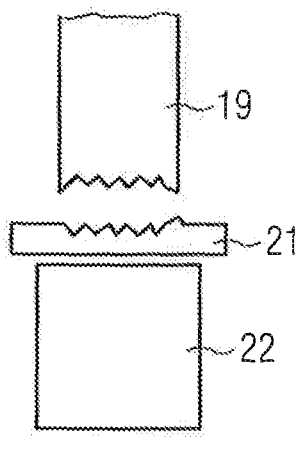
FIGS. 5, 6 and 7 show schematic sectional representations of method steps of a method for producing a ceramic conversion element according to an exemplary embodiment.
Figure 6:
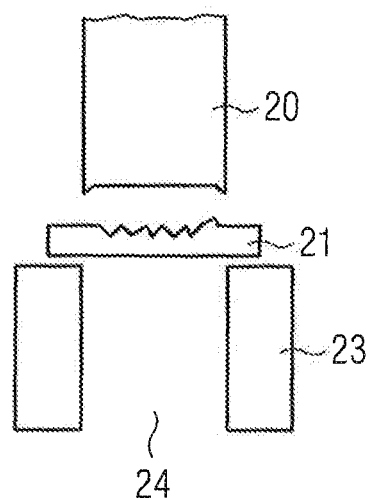
Figure 7:

Initially, the method of the embodiment of FIGS. 5 to 7 comprises the step of providing a base body 21, in which structure elements 4 are produced, as shown in FIG. 5. Here, the base body 21 is a green body and the structure elements 4 are produced by a first tool 19. The first tool 19 produces the structure elements 4 by embossing.

The first tool 19 comprises a stamp, which transfers a pattern of the stamp to the green body. The pattern of the stamp is formed as recesses or projections, which correspond to an inverse geometry of the structure elements 4.

The green body is arranged temporarily on a solid die 22. Subsequently, the stamp of the first tool 19 is pressed against the green body such that the structure elements 4 are formed in a central region of a top surface of the green body.

In a next step, according to FIG. 6, the green body is arranged temporarily on a hollow die 23. The hollow die 23 comprises an opening 24, which has a larger area in the lateral direction than an area in which the structure elements 4 are arranged, being the central region 2.

The green body with the central region 2 is arranged on the hollow die 23 such that the central region 2 is arranged in the center of the opening 24. Subsequently, the region of the green body overlapping with the opening 24 in plan view is pressed or punched through the opening 24 by the second tool 20.

Since the area of the opening 24 is preferably larger than the area of the central region of the green body, an edge area of the separated green body forms the frame 5.

Subsequently, the green body is sintered to the ceramic conversion element 1. During sintering the green body, the finished conversion element is diminished in size by approximately 15% to 20% compared to the volume of the green body. Furthermore, during the sintering process the structure elements 4 preferably shrink also by approximately 15% to 20%.

The invention is not limited to the description of the embodiments. Rather, the invention comprises any new feature as well as any combination of features, particularly any combination of features of the claims, even if the feature or the combination of features itself is not explicitly given in the claims or embodiments.

What is claimed is:

1. A light emitting device comprising:
    a radiation emitting semiconductor chip configured to emit primary radiation from a radiation exit area during operation;
    a ceramic conversion element arranged on the radiation exit area of the semiconductor chip, the ceramic conversion element comprising:
        a central region with a structured top surface comprising a plurality of structure elements; and
        a frame surrounding the central region, the frame having a planar top surface, wherein the central region and the frame are formed as one piece, wherein the ceramic conversion element is configured to convert primary radiation into secondary radiation of a different wavelength range; and
    a mold surrounding the semiconductor chip and the ceramic conversion element, wherein the mold is in direct contact with the semiconductor chip and the ceramic conversion element;
    wherein the structured top surface of the ceramic conversion element is free of the mold;
    wherein structure elements of the plurality of structure elements have a first height that is a maximal vertical extension of a first structure element of the plurality of structure elements in the central region and a second height that is a minimal vertical extension of a second structure element of the plurality of structure elements in the central region; and
    wherein the mold extends in a vertical direction to a third height that is between the first height and the second height or that is equal to the first height.

2. The light emitting device according to claim 1, wherein the planar top surface of the frame terminates flush with the structured top surface between neighboring structure elements.

3. The light emitting device according to claim 1, wherein the planar top surface of the frame protrudes above the structured top surface between neighboring structure elements in a vertical direction.

4. The light emitting device according to claim 1, wherein the frame and the central region are formed from the same material.

5. The light emitting device according to claim 1,
    wherein the structure elements are arranged in a regular pattern and spaced apart from one another so that there is a distance between direct neighboring structure elements, and
    wherein the frame has a width larger than or equal to the distance.

6. The light emitting device according to claim 1, wherein the structure elements are arranged in a non-regular pattern.

7. The light emitting device according to claim 1, wherein the structure elements are recesses, which do not completely penetrate through the ceramic conversion element.

8. The light emitting device according to claim 1, wherein the structure elements are formed as grooves extending parallel to one another.

9. The light emitting device according to claim 8,
    wherein the grooves comprise a first group and a second group, and
    wherein the first group extends transversely to the second group.

10. The light emitting device according to claim 1, wherein the structure elements are formed as recesses or projections, the recesses or projections being arranged in lines and columns.

* * * * *